United States Patent [19]

Hasegawa et al.

[11] Patent Number: 5,715,192

[45] Date of Patent: Feb. 3, 1998

[54] SEMICONDUCTOR MEMORY DEVICE

[75] Inventors: Takehiro Hasegawa, Tokyo; Fujio Masuoka, Yokohama, both of Japan

[73] Assignee: Kabushiki Kaisha Toshiba, Kawasaki, Japan

[21] Appl. No.: 502,947

[22] Filed: Jul. 17, 1995

Related U.S. Application Data

[63] Continuation of Ser. No. 156,836, Nov. 24, 1993, abandoned.

[30] Foreign Application Priority Data

Nov. 26, 1992 [JP] Japan ..................................... 4-317203

[51] Int. Cl.[6] ..................................................... G11C 11/34
[52] U.S. Cl. ..................... 365/177; 365/189.12; 365/194; 365/221; 365/240
[58] Field of Search ........................... 365/177, 189.12, 365/194, 221, 240

[56] References Cited

U.S. PATENT DOCUMENTS

| | | | |
|---|---|---|---|
| 4,150,392 | 4/1979 | Nonaka | 365/177 |
| 4,912,680 | 3/1990 | Masaki et al. | 365/189.12 |
| 4,961,169 | 10/1990 | Matsumura et al. | 365/189.12 |
| 4,975,880 | 12/1990 | Knierim et al. | 365/189.12 |
| 5,058,065 | 10/1991 | Diluna | 365/189.12 |
| 5,060,194 | 10/1991 | Sakui et al. | 365/177 |
| 5,309,393 | 5/1994 | Sakata et al. | 365/189.12 |

FOREIGN PATENT DOCUMENTS 2-1129 1/1990 Japan.

OTHER PUBLICATIONS

IEEE International Solid–State Circuits Conference, Feb. 1986, Nobumichi Okazaki, et al., "A 30ns 256K Full CMOS SRAM", pp. 204–205.

*Primary Examiner*—Joseph E. Clawson, Jr.
*Attorney, Agent, or Firm*—Oblon, Spivak, McClelland, Maier & Neustadt, P.C.

[57] ABSTRACT

A plurality of static memory cells including CMOS flip-flops and switching MOS transistors are connected in series, thereby forming a memory cell unit in which one end of data reading is connected to bit lines. A series of the memory cell units are arranged, thereby forming a memory cell array. Reset terminals are provided for releasing cell data and causing the cell to function temporarily as a transfer gate of data.

8 Claims, 5 Drawing Sheets

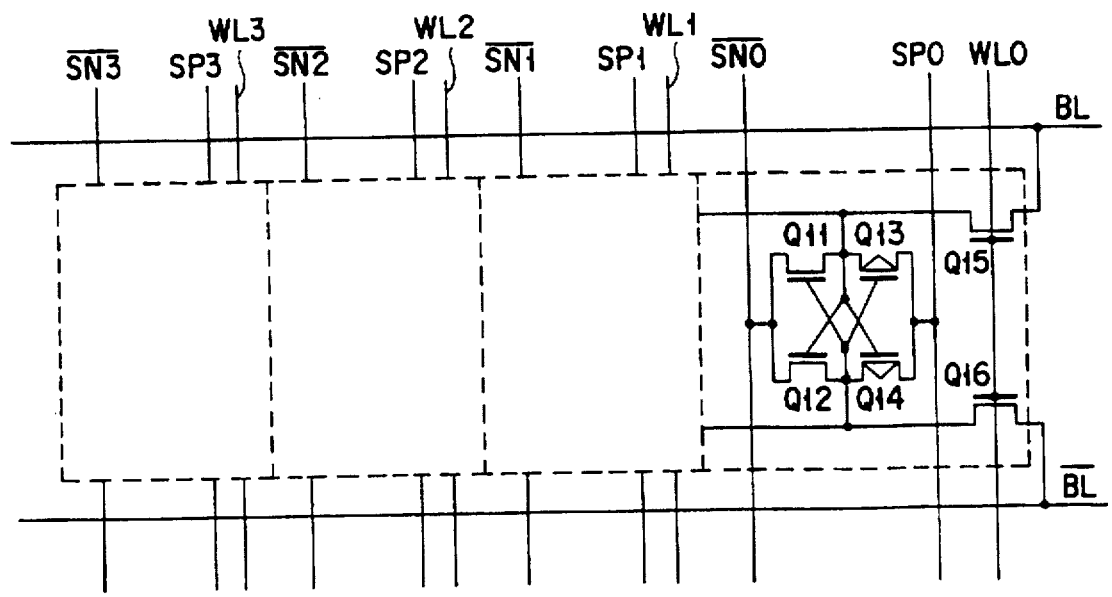
F I G. 1
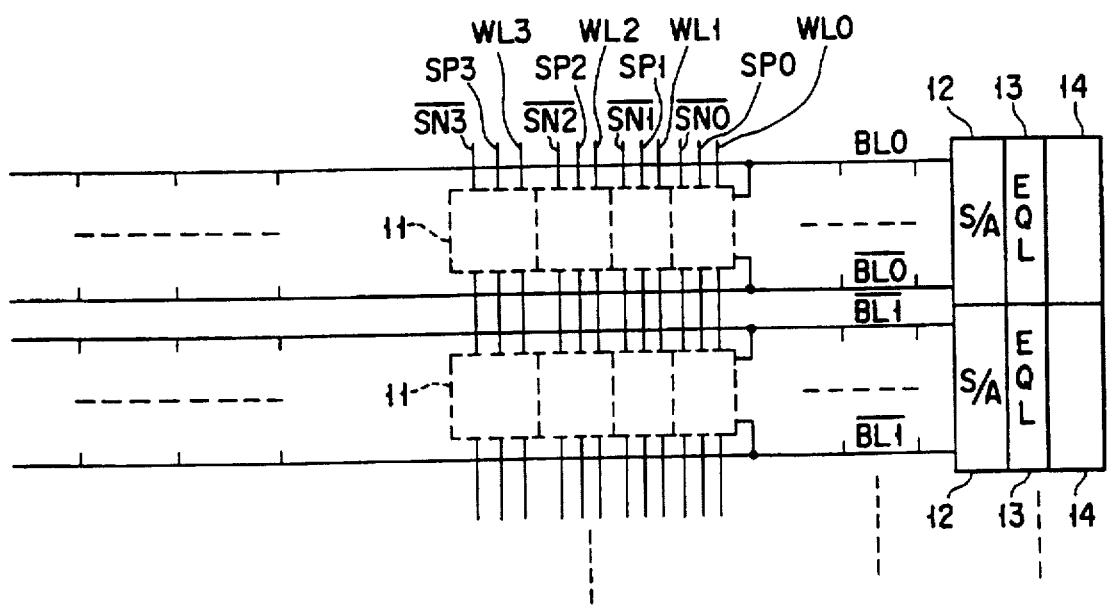
F I G. 2

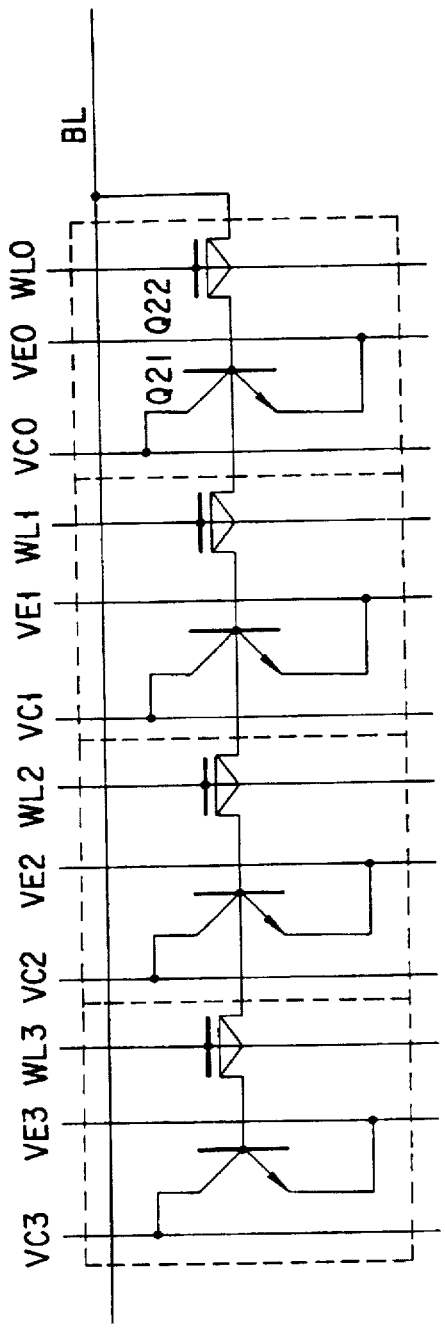
F I G. 4
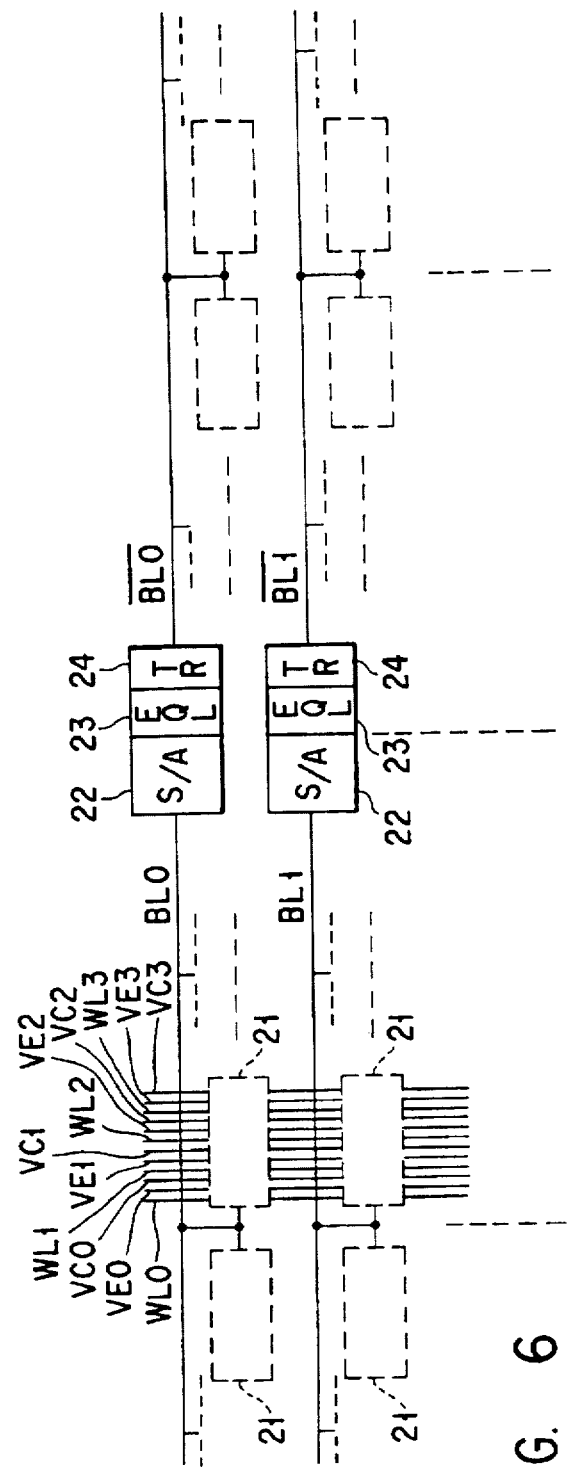
F I G. 6

SEMICONDUCTOR MEMORY DEVICE

This application is a Continuation of application Ser. No. 08/156,836, filed on Nov. 24, 1993, now abandoned.

BACKGROUND OF THE INVENTION

1. Field of the Invention

The present invention relates to a semiconductor memory device using a memory cell of static type and more particularly to a semiconductor memory device having an array of a memory unit having a plurality of memory cells connected in series.

2. Description of the Related Art

Conventionally, a static random access memory (SRAM) has been known as a random access memory characterized by a high-speed performance. The SRAM is structured such that data can be held in a flip-flop in a static manner. Unlike a dynamic RAM, no refresh operation is needed in SRAM. Moreover, SRAM has a feature of a low power consumption in addition to the high speed performance.

However, this type of semiconductor memory device using SRAM has the following problem. In SRAM, since one memory cell is formed of six elements (four transistors +two resistors, or six transistors), an area per one cell of SRAM is about four times as large as that of DRAM. Due to this, it is difficult to make the memory capacity larger as compared with the case of DRAM, and the manufacture cost increases if the same memory capacity is used.

As mentioned above, though SRAM has the advantages of high-speed performance, the area per cell of SRAM is larger than that of DRAM, so that the manufacturing cost is high.

SUMMARY OF THE INVENTION

An object of the present invention is to provide a semiconductor memory device which can reduce a cell area using SRAMS, and which can contribute to reduction of a manufacturing cost and enlargement of a memory capacity.

According to the present invention, a plurality of static memory cells are connected in series to form a memory cell unit, and a cell area is made small, and a function as a transfer gate is provided to each memory cell, thereby performing a stable reading operation.

More specifically, according to the present invention, there is provided a semiconductor memory device characterized by bit line; and a memory cell array having a plurality of memory cell units, wherein each of said plurality of memory cell units has at least one terminal and is formed of a plurality of static memory cells connected in series, and at least one of said terminals is connected to said bit line.

The present invention is further characterized in that said static memory cell includes a reset terminal to which an signal for releasing cell data holding and rendering said memory cell function temporarily as a transfer gate of data is inputted.

The above static memory cell includes one of an element forming a flip-flop and an element formed of a bipolar transistor whose base current flowing direction changes in accordance with a base potential and a MOS transistor for switching connected to the base of said bipolar transistor.

The flip-flop is formed by complementarily connecting two n-channel MOS transistors and two p-channel MOS transistors.

In addition, the present invention is characterized by register means for temporarily storing data stored in the memory cell.

Moreover, the present invention is characterized in that the register means includes one of a memory cell unit having the same structure as the memory cell unit and a dynamic semiconductor memory device.

According to the semiconductor memory device of the present invention, since the plurality of static memory cells are connected in series, the number of contacts between a bit line and a memory cell can be reduced, and the cell area can be reduced. Moreover, a reset terminal is provided to each memory cell to function as a transfer gate for data, so that data reading can be stably performed.

Therefore, according to the present invention, there can be provided a semiconductor memory device which can reduce a cell area using SRAMS, and which can contribute to reduction of a manufacture cost and enlargement of a memory capacity.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a view of a circuit structure showing a main part of the semiconductor memory device of a first embodiment of the present invention;

FIG. 2 is a view of a circuit structure showing a memory array and its peripheral circuit of the first embodiment of the present invention;

FIG. 4 is a view of a circuit structure showing a main part of the semiconductor memory device of a second embodiment of the present invention;

FIG. 6 is a view of a circuit structure showing a memory array and its peripheral circuit of the second embodiment of the present invention.

DETAILED DESCRIPTION OF THE PREFERRED EMBODIMENTS

Figure 3:
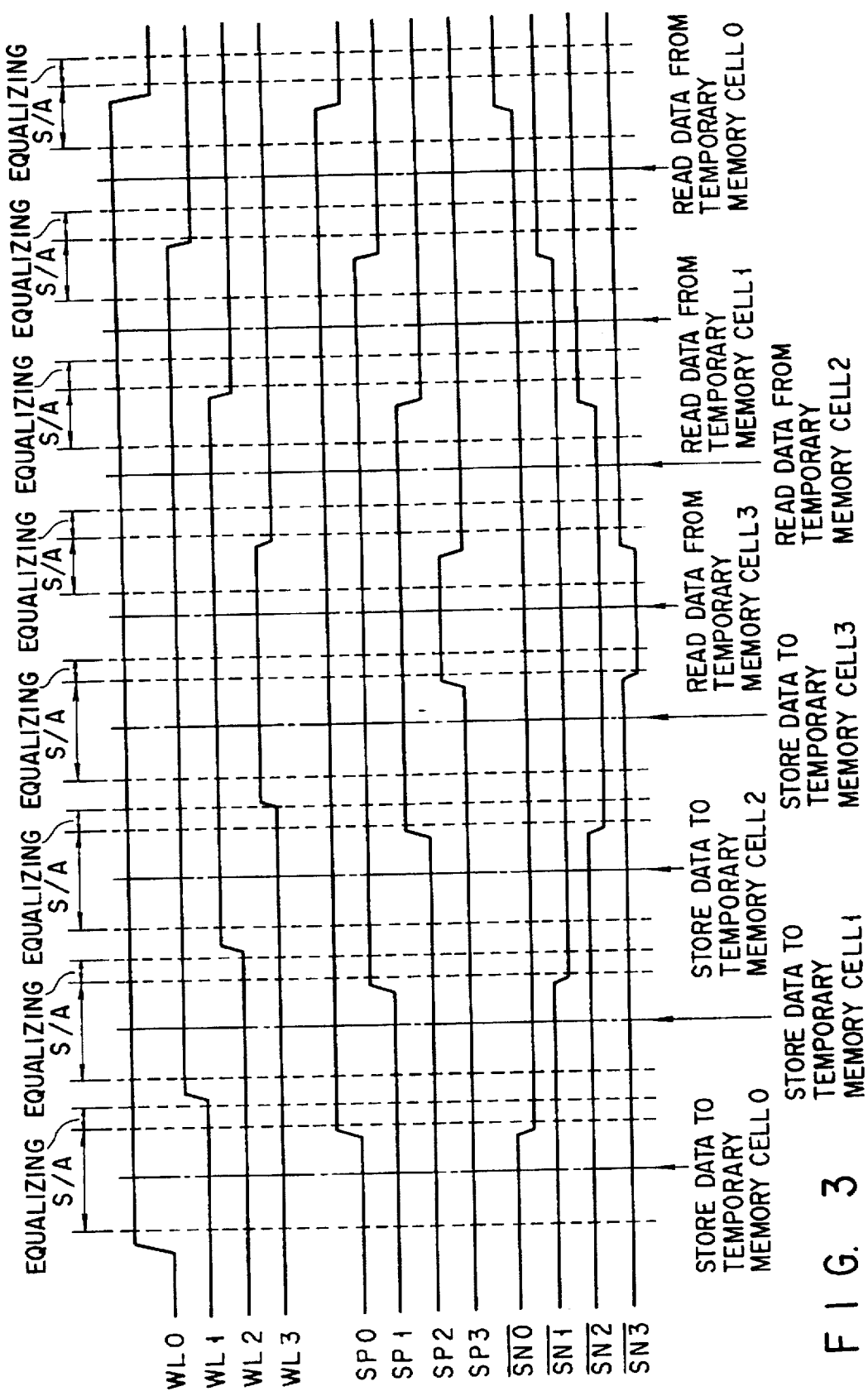
FIG. 3 is a view of a signal waveform showing an operation timing of the first embodiment.

Embodiments of the present invention will be explained with reference to the drawings.

FIG. 1 is a view of a circuit structure showing a main part (memory cell portion) of the semiconductor memory device of a first embodiment of the present invention. In the first embodiment, the number of memory cells connected in series is set to four to form one memory cell unit. However, the number of memory cells connected in series may be in other number, as well.

Each memory cell has n-channel MOS transistors $Q_{11}$ and $Q_{12}$, a CMOS flip-flop comprising a p-channel MOS transistor $Q_{13}$ and $Q_{14}$, and n-channel MOS transistors $Q_{15}$ and $Q_{16}$ for switching.

Moreover, each memory cell has a signal terminal $\overline{SN}i$ (i=0 to 3; first reset terminal), which is set to a low voltage state (e.g., ground potential) for holding cell data and set to a precharge potential of a bit line for releasing held cell data, and a signal terminal $\overline{SP}i$ (i=0 to 3; second reset terminal), which is set to a high voltage state (e.g., power supply potential) for holding cell data and set to the precharge potential of the bit line for releasing held cell data.

According to the semiconductor memory device of the present invention, four memory cells are connected in series to form the memory cell unit. Gates of n-channel MOS transistors $Q_{15}$ and $Q_{16}$ are connected to a word line WLi (i=0 to 3).

FIG. 2 is a view of a circuit structure showing a memory array and its peripheral circuit of the first embodiment of the present invention. A plurality of memory cell units 11 are connected to a pair of bit lines (BLi, $\overline{BL}$i). The pair of bit lines are connected to a sense amplifier 12 for reading a signal and a circuit 13 (EQL) for equalizing and precharging the bit lines. Though it is omitted in FIG. 2, a dummy cell and a spare cell may be added to a memory cell unit. Moreover, since an I/O line to/from an outer unit is the same as the case of the prior art, an illustration thereof is omitted.

In the first embodiment, a 4-bit temporary memory register 14 is connected to each sense amplifier 12. The temporary memory register 14 temporarily stores data of a memory cell unit 11 while data is read from the memory cell unit 11. The temporary memory register 14 may be formed of the same cell as the memory cell unit 11, or the cell of the conventional SRAM or DRAM.

FIG. 3 is a view showing a word line WL, and timing of signal of signal terminals SP and $\overline{SN}$.

A case in which data of the memory cell unit 11 is read (i.e., a case in which data is stored in the temporary register 14) will be explained as follows.

A case in which data of the first memory cell is read will be explained as follows.

After the bit line BL is precharged, $WL_0$ is set to be in an "H" state. At the time when data of the first memory cell is transmitted to a sense amplifier 12, the sense amplifier 12 is activated, data of the first memory cell is stored in one cell (e.g., first cell $TR_0$) of the temporary memory register 14. Thereafter, a signal terminal $SP_0$ is set to a precharge potential ($V_{cc}/2$ in this embodiment) and a signal terminal $\overline{SN}_0$ is set to a precharge potential, and the first cell from which data is read is deactivated. Sequentially, the sense amplifier is deactivated, and the pair of the bit lines are equalized and precharged, and a next data reading is on standby.

The case where data is read from the second memory cell will be explained.

$WL_1$ rises to "H" in a state that $WL_0$ is set to "H", data is read from the second memory cell through the first memory cell similar to the reading of the first memory cell. In the temporary memory register 14, the data is stored in the cell in which data of the first memory cell is not stored (e.g., second cell $TR_1$).

Data reading of the third and fourth memory cells is performed in the same method of data reading of the first and second memory cells.

Data rewriting to the memory cell unit 11 (i.e., reading data stored in the temporary memory register 14) is performed in reverse order of the data reading from the memory cell.

The pair of bit lines BL, $\overline{BL}$ are equalized and precharged, data of the fourth memory cell is read from the cell (e.g., fourth cell $TR_3$) of the temporary memory register 14 to the sense amplifier 12. Sequentially, the sense amplifier 12 is activated, and data read from the cell of the temporary memory register 14 is rewritten to the fourth memory cell of the memory cell unit 11. Thereafter, $\overline{SN}_3$ is set to "L" and $SP_3$ is set "H", and data is latched. Then, $WL_3$ is set to "L", and data rewriting is ended, and the pair of the bit lines are equalized and precharged, and a next data reading is on standby.

The third, second and first memory cells are rewritten in the same manner as the case of the fourth memory cell, and the data rewriting is ended.

As mentioned above, in the semiconductor memory device, the memory cells, which are formed of the flip-flop, are connected in series, thereby forming the memory cell unit 11. In addition, the reset terminals (SP, SN), which make the memory cell function temporarily as the transfer gate after releasing the cell data holding, is provided in each memory cell. Therefore, in the semiconductor memory device of the present invention, data can be sequentially read from the memory cell close to the sense amplifier 12, and data can be sequentially rewritten to the memory cell far from the sense amplifier 12. According to the semiconductor memory device of present invention, since the number of contacts between the bit lines and the memory cells can be reduced, the cell area can be reduced, thereby reducing the manufacturing cost and enlarging the capacity.

FIG. 4 is a view of a circuit structure showing the main part of the semiconductor memory device of the second embodiment of the present invention.

Figure 5:
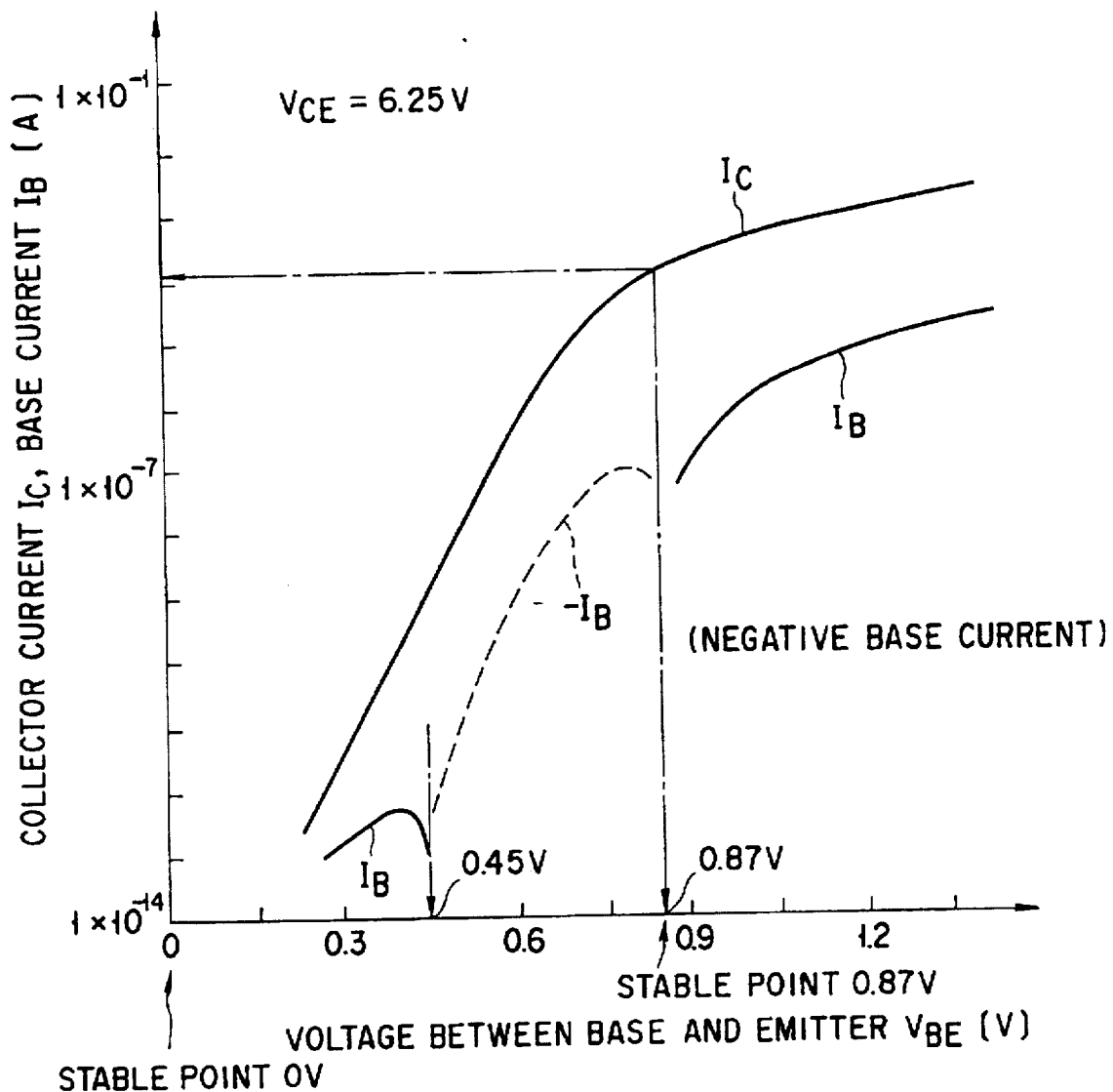
FIG. 5 is a view showing a characteristic of a bipolar transistor of the memory cell of the second embodiment.

The memory cell used in the second embodiment comprises an npn bipolar transistor $Q_{21}$ whose base current flowing direction changes by the base potential having a character as shown in FIG. 5, and a transfer gate of a p-channel MOS transistor $Q_{22}$ (see Jpn. Pat. Appln. KOKAI Publication No. 2-1129).

The bipolar transistor having the characteristic shown in FIG. 5 has a stable point at two points of the base potentials (0V, 0.87V) at which the base current flowing direction changes from the direction where the current flows into the base to the direction where the current flows out of the base. Due to this, the bipolar transistor can be used in a binary memory as a bistable element. The memory cell of the second embodiment may be formed of a pnp bipolar transistor and a transfer gate of an n-channel MOS transistor.

The semiconductor memory device of the second embodiment comprises four memory cells as explained above that are connected in series. A word line WLi (i=0 to 3) is connected to the gate of the MOS transistor of each memory cell, a control signal line VEi (i=0 to 3) is connected to the emitter of the bipolar transistor and the collector, and a control signal line VCi (i=0 to 3) is connected to the collector as a reset terminal.

FIG. 6 shows the memory cell array and its peripheral circuit of the second embodiment. The circuit of the second embodiment is arranged by the open bit line structure. Similar to the first embodiment, a plurality of memory units 21 are connected to the pair of bit lines (BLi, $\overline{BL}$i). The pair of bit lines are connected to a sense amplifier 22 (S/A), a circuit 23 (EQL) for equalizing and precharging. A 4-bit temporary register 24 (TR) is connected to the sense amplifier 22.

Figure 7:
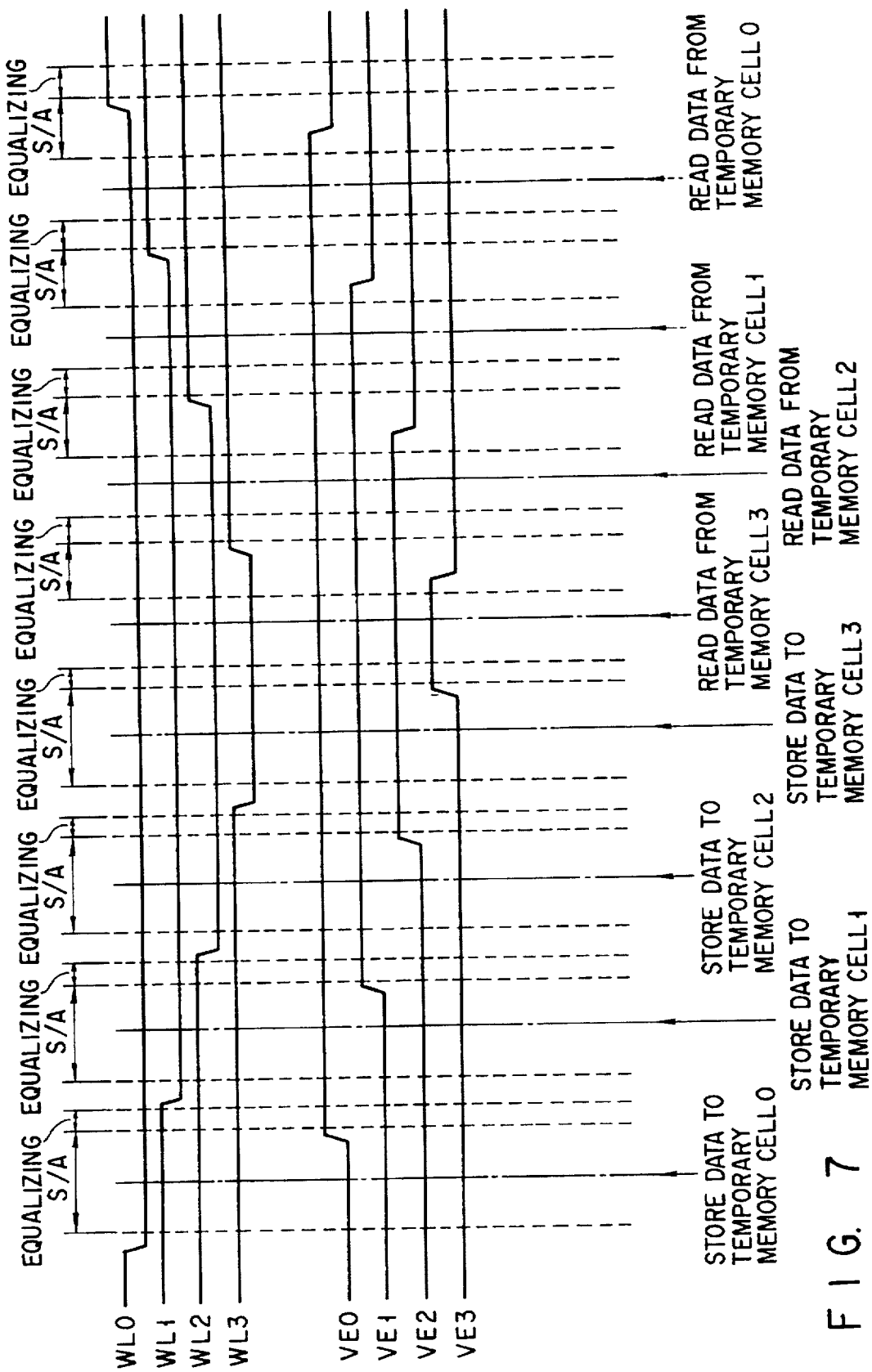
FIG. 7 is a view of a signal waveform showing an operation timing of the second embodiment.

FIG. 7 is a view showing a word line WL, and timing of a signal of a reset terminal VE. In this case, VCi (i=0 to 3) is set to a power voltage $V_{cc}$.

A case in which data is read from the memory unit 21 (a case in which data is stored in a register will be explained.

First, a case in which data is read from the first memory cell will be explained.

After precharging the bit line BL, $WL_0$ falls. At the time when data of the first memory cell is transmitted to the sense amplifier 22, the sense amplifier 22 is activated, data is stored in one cell (e.g., first cell $TR_0$) of the temporary memory register 24. Thereafter, if $VE_0$ is set to "H", and the conjunction between the base of the bipolar transistor and the emitter is set to be in a reverse bias, the terminal of the base is in a high impedance state. Due to this, the cell is deactivated. Sequentially, after deactivating the sense amplifier 12, the pair of the bit lines is equalized and precharged, and the next reading is on standby.

Next, a case in which data is read from the second memory cell will be explained.

$WL_1$ falls to "L" in a state that $WL_0$ is set to "L", and data is read from the second memory cell through the first memory cell similar to the reading of the first memory cell. The temporary memory register 24 is stored in the cell (e.g., second cell $TR_2$) in which data of the first memory cell is not stored.

Data reading of the third and fourth memory cells is performed in the same method of data reading of the first and second memory cells.

Data rewriting to the memory cell unit 21 (i.e., reading data stored in the temporary memory register 14) is performed in reverse order of the data reading from the memory cell.

The pair of bit lines BL, $\overline{BL}$ are equalized and precharged, data of the fourth memory cell is read from the cell (e.g., fourth cell $TR_3$) of the temporary memory register 24 to the sense amplifier 22. Sequentially, the sense amplifier 22 is activated, and data read from the cell of the temporary memory register 24 is rewritten to the fourth memory cell of the memory cell unit 11. Thereafter, $VE_3$ is set to "L", and data is latched. Then, $WL_3$ is set to "H", and data rewriting is ended, and the pair of the bit lines are equalized and precharged, and a next data reading is on standby.

The third, second and first memory cells are rewritten in the same manner as the case of the fourth memory cell, and the data rewriting is ended.

According to the second embodiment, similar to the first embodiment, the number of contacts between the bit line and the memory cell can be reduced. Due to this, the cell area can be reduced, so that the manufacturing cost can be reduced, and the capacity can be enlarged. In addition, since one cell is formed of two elements, i.e., the bipolar transistor and the MOS transistor, the cell area can be more reduced than the first embodiment.

In the first and second embodiments, though the reset terminal was formed in the memory cell, no reset terminal may be formed therein. In this case, the word line rises in a state that the bit lines are set to the intermediate potential (precharge potential) when reading data. Thereafter, the precharge is released, thereby making it possible to perform the same functions as the first and second embodiments.

The present invention is not limited to the above-mentioned embodiments.

In the first and second embodiments, and SRAM was used as a memory cell, but the present invention can also be applied to a DRAM or a nonvolatile memory. The number of the memory cells to be connected in series and the number of the memory cell units to be connected to the bit line can be suitably changed in accordance with the specification.

In addition, the present invention can be variously modified within the scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a memory cell array having a plurality of memory cell units, each of which comprises a plurality of static memory cells, each of which consists of two elements and at least one of said two elements comprising a bistable element, connected in series;

a plurality of bit lines to which said plurality of memory cell units are coupled in a column direction; and a plurality of word lines to which said plurality of static memory cells are coupled in a row direction, each of said memory cells being capable of independently storing data and holding data by supplying a predetermined voltage during operation, wherein said plurality of word lines coupled to said plurality of static memory cells are selectively activated for reading out data in said memory cell unit in the order in which the memory cells corresponding to said word lines are arranged from.

2. A device according to claim 1, wherein said two elements are a bipolar transistor whose base current flowing direction changes to a direction of flowing from the base in accordance with an increase in a base potential and a MOS transistor for witching connected to the base of said bipolar transistor.

3. A device according to claim 1 or 2, further comprising register means for temporarily storing data stored in said static memory cell.

4. A semiconductor memory device comprising:

a memory cell array constituted by a plurality of memory cell units, each of said memory cell units constituted by a plurality of static memory cells, each of which consists of two elements and at least one of said two elements comprising a bistable element, connected in series;

a plurality of word lines to which said plurality of static memory cells are coupled in a row direction, each of said memory cells being capable of independently storing data and holding data by supplying a voltage and having a latch releasing terminal to which a signal for releasing cell data and causing a memory cell to function as a transfer gate is inputted, and wherein said word lines connected to said memory cell unit are selectively activated for reading out data in said memory cell unit in the order in which the memory cells corresponding to said word lines are arranged from, the contact point where said memory cell unit is coupled to said bit line and each of said latch releasing the latched data in the corresponding cell after reading out data in the corresponding cell.

5. A device according to claim 4, wherein said two elements are a bipolar transistor whose base current flowing direction changes to a direction of flowing from the base in accordance with an increase in a base potential and a MOS transistor for switching connected to the base of said bipolar transistor.

6. A device according to claim 4 or 5, further comprising register means for temporarily storing data stored in said static memory cell.

7. A semiconductor memory device comprising:

a memory cell having a plurality of memory cell units, each of which comprises a plurality of static memory cells connected in series;

a plurality of bit lines to which said plurality of memory cell units are coupled in a column direction; and a plurality of word lines to which said plurality of static memory cells are coupled in a row direction, each of said memory cells being capable of independently storing data and holding data by supplying a predetermined voltage during operation, wherein said plurality of word lines coupled to said plurality of static memory cells are selectively activated for reading out data in said memory cell unit in the order in which the memory cells corresponding to said word lines are arranged from, and wherein each of said static memory cells includes a bipolar transistor whose base current flowing direction changes to a direction of flowing from the base in accordance with an increase in a base potential and a MOS transistor for switching connected to the base of said bipolar transistor.

8. A semiconductor memory device comprising:

a memory cell array constituted by a plurality of memory cell units, each of said memory cell units constituted by a plurality of static memory cells connected in series;

a plurality of bit lines to which said plurality of static cell units are coupled in a column direction; and a plurality of word lines to which said plurality of static memory cells are coupled in a row direction, each of said memory cells being capable of independently storing data and holding data by supplying a voltage and having a latch releasing terminal to which a signal for releasing cell data and causing a memory cell to function as a transfer gate is inputted, wherein said word lines connected to said memory cell unit are selectively activated for reading out data in said memory cell unit in the order in which the memory cells corresponding to said word lines are arranged from, wherein the contact point where said memory cell unit is coupled to said bit line and each of said latch releasing the latched data in the corresponding cell after reading out data in the corresponding cell, and wherein each of said static memory cells includes a bipolar transistor whose base current flowing direction changes to a direction of flowing from the base in accordance with an increase in a base potential and a MOS transistor for switching connected to the base of said bipolar transistor.

* * * * *